(12) United States Patent
Johnson et al.

(10) Patent No.: US 7,921,005 B2
(45) Date of Patent: Apr. 5, 2011

(54) METHOD FOR SELECTING CONDUCTORS OF AN OVERHEAD POWER TRANSMISSION LINE

(75) Inventors: Douglas E. Johnson, Minneapolis, MN (US); Anton F. Jachim, St. Paul, MN (US)

(73) Assignee: 3M Innovative Properties Company, St. Paul ( * ) Notice: Subject to any disclaimer, the term of this patent is extended or adjusted under 35 U.S.C. 154(b) by 916 days.

(21) Appl. No.: 11/617,480

(22) Filed: Dec. 28, 2006

(65) Prior Publication Data
US 2008/0162106 A1 Jul. 3, 2008

(51) Int. Cl.
G06G 7/54 (2006.01)
G06G 17/50 (2006.01)
(52) U.S. Cl. ............................................. 703/18; 703/1
(58) Field of Classification Search ................ 703/1, 18; 707/104.1, E17.044
See application file for complete search history.

(56) References Cited

U.S. PATENT DOCUMENTS

| | | | |
|---|---|---|---|
| 2,790,843 A | 4/1957 | Gordon | |
| 2,831,048 A | 4/1958 | Weaver | |
| 3,145,259 A | 8/1964 | Leonard et al. | |
| 3,234,319 A | 2/1966 | Gill | |
| 3,676,578 A | 7/1972 | Cahill | |
| 3,709,706 A | 1/1973 | Sowman | |
| 3,795,524 A | 3/1974 | Sowman | |
| 4,047,965 A | 9/1977 | Karst et al. | |
| 4,346,255 A | 8/1982 | Nigol | |
| 4,362,352 A | 12/1982 | Hawkins et al. | |
| 4,679,672 A | 7/1987 | Seddon et al. | |
| 4,686,325 A * | 8/1987 | Marsico et al. ............. 174/40 R |
| 4,954,462 A | 9/1990 | Wood et al. | |
| 5,171,942 A | 12/1992 | Powers | |
| 5,185,299 A | 2/1993 | Wood et al. | |
| 5,501,906 A | 3/1996 | Deve | |
| 5,554,826 A | 9/1996 | Gentry | |
| 5,689,417 A | 11/1997 | Shockley et al. | |
| 5,789,701 A | 8/1998 | Wettengel et al. | |
| 5,933,355 A * | 8/1999 | Deb ................................ 702/60 |
| 6,127,625 A | 10/2000 | Castano | |
| 6,180,232 B1 | 1/2001 | McCullough et al. | |
| 6,191,354 B1 | 2/2001 | Castano et al. | |

(Continued)

FOREIGN PATENT DOCUMENTS

JP 2002-199569 7/2002

(Continued)

OTHER PUBLICATIONS

Dipeen Dama, Dzevad Mufic and Riaz Vajeth, "Conductor Optimisation for Overhead Transmission Lines", Jul. 2005.*

(Continued)

*Primary Examiner* — Kamini S Shah
*Assistant Examiner* — Angel J Calle
(74) *Attorney, Agent, or Firm* — Gregory D. Allen; James A. Baker

(57) ABSTRACT

Methods for selecting a conductor configuration of an overhead power transmission line tension section between two dead-end towers when the conductor configuration includes at least two different types of conductors. Geographical profile information and overhead power transmission line preferences are used along with predetermined selection rules when selecting the appropriate conductor configuration. Some examples of overhead power transmission line preferences include electrical characteristics and conductor sag between towers, while examples of selection rules include conductor costs and conductor tension.

19 Claims, 8 Drawing Sheets

U.S. PATENT DOCUMENTS

| | | | |
|---|---|---|---|
| 6,245,425 | B1 | 6/2001 | McCullough et al. |
| 6,304,838 | B1* | 10/2001 | Brown .......................... 703/18 |
| 6,329,056 | B1 | 12/2001 | Deve et al. |
| 6,336,495 | B1 | 1/2002 | McCullough et al. |
| 6,344,270 | B1 | 2/2002 | McCullough et al. |
| 6,447,927 | B1 | 9/2002 | McCullough et al. |
| 6,460,597 | B1 | 10/2002 | McCullough et al. |
| 6,485,796 | B1 | 11/2002 | Carpenter et al. |
| 6,523,424 | B1 | 2/2003 | Hayes et al. |
| 6,544,645 | B1 | 4/2003 | McCullough et al. |
| 6,559,385 | B1 | 5/2003 | Johnson et al. |
| 6,692,842 | B2 | 2/2004 | McCullough et al. |
| 6,723,451 | B1 | 4/2004 | McCullough et al. |
| 6,796,365 | B1 | 9/2004 | McCullough et al. |
| 6,913,838 | B2 | 7/2005 | McCullough et al. |
| 7,057,103 | B1 | 6/2006 | Peabody |
| 7,093,416 | B2 | 8/2006 | Johnson et al. |
| 7,131,308 | B2 | 11/2006 | McCullough et al. |
| 7,494,271 | B2* | 2/2009 | Scholtz et al. .................. 374/45 |
| 7,516,051 | B2* | 4/2009 | Johnson et al. ................... 703/2 |
| 2004/0267513 | A1* | 12/2004 | Westermann et al. .......... 703/18 |
| 2005/0181228 | A1 | 8/2005 | McCullough et al. |
| 2006/0102377 | A1 | 5/2006 | Johnson et al. |
| 2006/0102378 | A1 | 5/2006 | Johnson et al. |
| 2006/0239238 | A1* | 10/2006 | Fernandez-Corbaton et al. ................................ 370/342 |
| 2007/0009224 | A1* | 1/2007 | Browning ..................... 385/147 |
| 2007/0038396 | A1* | 2/2007 | Zima et al. ....................... 702/65 |
| 2007/0093995 | A1* | 4/2007 | Mollenkopf et al. ............. 703/4 |
| 2007/0271081 | A1* | 11/2007 | Johnson et al. ................. 703/18 |

FOREIGN PATENT DOCUMENTS

| | | |
|---|---|---|
| JP | 2006-333651 | 12/2006 |

OTHER PUBLICATIONS

"HTLS Conductors: Reliability and Cost," A Proposal in Response to Funding Opportunity No. DE-PS02-05CH11270 to The U.S. Department of Energy, 3M Company, Jul. 2005, pp. 1-22.

U.S. Patent Application entitled "Ultrasonic Energy System and Method Including a Ceramic Horn," filed on Mar. 31, 2003, having U.S. Appl. No. 10/403,643.

U.S. Patent Application entitled "Ceramic Oxide Fibers," filed on Dec. 28, 2006, having U.S. Appl. No. 11/616,963.

U.S. Patent Application entitled "Installation of Spliced Electrical Transmission Cables," filed on Mar. 7, 2006, having U.S. Appl. No. 11/276,607.

U.S. Patent Application entitled "Overhead Electrical Power Transmission Line," filed on Dec. 28, 2006, having U.S. Appl. No. 11/617,461.

U.S. Patent Application entitled "Overhead Electrical Power Transmission Line," filed on Dec. 28, 2006, having U.S. Appl. No. 11/617,494.

U.S. Patent Application entitled "Overhead Power Transmission Line Conductor Selection," filed on May 19, 2006, having U.S. Appl. No. 11/419,365.

Transmission and Distribution Committee, of the IEEE Power Engineering Society, "IEEE Standard for Calculating the Current-Temperature Relationship of Bare Overhead Conductors", Institute of Electrical and Electronics Engineers standard # 738, 1993, Calculation Module 23, IEEE Corporate Office.

Thrash et al, "Overhead Conductor Manual", Southwire Company Overhead Conductor Manual, First Edition 1994.

"A Method of Stress-Strain Testing of Aluminum Conductors and ACSR and a Method for Determining the Long Time Creep of Aluminum Conductors in Overhead Line", Aluminum Association Guide, Rev. 1999.

Kelly, D. K, and Jancauskas, J. R.; "Cable Sizing—Avoid Shortcuts and Do it Right", IEEE, 1996, pp. 2341-2346.

Kirshnasamy, S. G., Ford, G. L., and Orde, C. I.; "Predicting the Structural Performance of Transmission Lines Uprated by Reconductoring", IEEE Transactions on Power Apparatus and Systems, vol. PAS-100, No. 5, May 1981, pp. 2271-2277.

Chen, S.L., Black, W. Z., Loard, H. W. Jr.; "High Temperature Ampacity Model for Overhead Conductors", IEEE Transactions on Power Delivery, vol. 17, No. 4, Oct. 2002, pp. 1136-1141.

Chen, S.L., Black, W. Z., Loard, H. W. Jr.; "Closure on High Temperature Ampacity Model for Overhead Conductors", IEEE Transaction on Power Delivery, vol. 18, No. 2, Apr. 2003, pp. 647.

Chen, S.L., Black, W. Z., Fancher, M. L.; "High Temperature Sag Model for Overhead Conductors", IEEE Transaction on Power Delivery, vol. 18, No. 1, Jan. 2003, pp. 183-188.

Chen, S.L., Black, W. Z., Fancher, M. L.; "Closure on 'High Temperature Sag Model for Overhead Conductors' ", IEEE Transaction on Power Delivery, vol. 18, No. 4, Oct. 2003. pp. 1600-1601.

Filipovic-Gledja, V., Morgan, V. T., and Findlay, R. D.; "A Unified Model for Predicting the Electrical, Mechanical and Thermal Characteristics of Stranded Overhead-Line Conductors", Department of Electrical and Computer Engineering, McMaster University, Hamilton, Ontario, Canada, pp. 182-185.

Morgan, V. T.; Discussion of "High Temperature Ampacity Model for Overhead Conductors", IEEE Transactions on Power Delivery, vol. 18, No. 2, Apr. 2003, pp. 646-647.

Morgan, V. T., Discussion of "High Temperature Sag Model for Overhead Conductors", IEEE Transaction on Power Delivery, vol. 18, No. 4, Oct. 2003. pp. 1600.

Peyrot, A. H.; "Microcomputer-Based Nonlinear Structural Analysis of Transmission Line Systems", IEEE Transactions on Power Apparatus and Systems, vol. PAS-104, No. 11, Nov. 1985, pp. 3236-3244.

Ringler, P.; "Automated Methods of Power-Line Design/Analysis", Transmission & Distribution, Oct. 1990, pp. 70-73.

Rodolakis, A. J.; "Point-and-Click Cable Ampacity Studies", IEEE, Apr. 1998, pp. 53-56.

PLS-CADD™ (Power Line Systems—Computer Aided Design and Drafting), PowerLine® Systems Inc., <http://www.powline.com/products/pls_cadd.html>, pp. 1-9 [retrieved from the internet on Mar. 15, 2006].

Pondera Engineers, LLC, "Products, Nip & Tuck, Transmission Line Design and Engineering", <http://www.ponderaengineers.com/products/niptuck.asp>, [retrieved from the internet on Sep. 13, 2006].

Pondera Engineers, LLC, "Products, TLCADD, Transmission Line Design and Engineering", <http://www.ponderaengineers.com/products/tlcadd.asp>, [retrieved from the internet on Sep. 13, 2006].

Pondera Engineers, LLC, "Products, LD-DigiCAD—Transmission Line Design and Engineering", <http://www.ponderaengineers.com/products/ld-digicad.asp>, [retrieved from the internet on Sep. 13, 2006].

Pondera Engineers, LLC, "Products, PoleSTAR—3D Structure Analysis and Design", <http://www.ponderaengineers.com/products/polestar.asp>, [retrieved from the internet on Sep. 13, 2006].

RateKit Thermal Rating ToolKit, "Products, Ratekit Thermal Rating Toolkit, Ratekit Brochure", <http://www.cat-1.com/ratekit.html>, [retrieved from the internet on Sep. 5, 2006].

Pondera Engineers, "Products, TL-Pro Design Studio—Transmission Line Design and Engineering", <http://www.ponderaengineers.com/products/tl-pro_studio.asp>, [retrieved from the internet on Sep. 5, 2006].

* cited by examiner

METHOD FOR SELECTING CONDUCTORS OF AN OVERHEAD POWER TRANSMISSION LINE

BACKGROUND

Overhead (electrical) power transmission line include: support structures, or towers, insulators, and a conductor that is supported by the towers. In some cases, long distances may be covered by an overhead power transmission line. An overhead power transmission line typically includes: multiple dead-end towers, multiple tangent (suspension) towers and conductors. Typically, one type of conductor is used in the construction of the entire overhead power transmission line comprising multiple tangent and dead-end towers.

SUMMARY

In general, the invention is directed to methods for selecting a conductor configuration within a transmission line tension section when the conductor configuration includes at least two different types of conductors that are spliced in series, where different types of conductors have at least one different parameter between them. A transmission line tension section refers to a portion of the overhead power transmission line that extends from one dead-end tower to another dead-end tower; a transmission line tension section can include multiple tangent towers. The distance between two adjacent towers, either tangent (also referred to as "suspension") or dead end towers, is referred to as a span. A tension subsection is some portion of the transmission line tension section that includes only one type of conductor. This tension subsection may cover more or less than one span between two adjacent towers, and two different tension subsections may meet within a span or at a tower. The conductor configuration defines the multiple tension subsections of the transmission line tension section (e.g., how much of the transmission line tension section is made up of each conductor type). As an example, two tension subsections that make up a portion of the overhead power transmission line may meet within a span or at the attachment point to a tower. Geographical profile information and overhead power transmission line preferences are used along with predetermined selection rules when selecting the appropriate conductor configuration.

While a user may manually use preferences and equations to determine the useful (including the most desirable or best) available conductor configuration(s) of an overhead power transmission line, a computing device may more efficiently aid the user throughout the selection process. The user may provide transmission line input to define preferences or requirements of the conductor configuration. Some examples of transmission line preferences include electrical characteristics and conductor sag, while examples of selection rules include conductor costs and conductor tension.

In one embodiment, the invention is directed to a method for selecting conductors for an overhead power transmission line including identifying at least one desired parameter of the overhead power transmission line to be supported by at least two towers and selecting a conductor configuration of the overhead power transmission line based upon the identified at least one desired parameter and selection rules. The conductor configuration comprises at least a first conductor and a second conductor of different conductor types.

In another embodiment, the invention is directed to a system that selects conductors for an overhead power transmission line that includes a processor that identifies at least one desired parameter of the overhead power transmission line to be supported by at least two towers and selects the conductor configuration of the overhead power transmission line based upon the identified at least one desired parameter and selection rules. The conductor configuration comprises at least the first conductor and the second conductor of different conductor types.

In an alternative embodiment, the invention is directed to a computer-readable medium having instructions that cause a processor to identify at least one desired parameter of the transmission line tension section to be supported by two dead-end towers and select the conductor configuration of the overhead power transmission line based upon the identified at least one desired parameter and selection rules. The conductor configuration comprises at least the first conductor and the second conductor of different conductor types.

The invention may provide one or more advantages. For example, an overhead power transmission line tension section may be constructed using the advantages available from at least two types of different conductors. This may allow conductors with different sag characteristics or other characteristics (e.g., different ampacity) to be used together where they are needed in the overhead power transmission line tension section. Moreover, these overhead power transmission lines may allow less support structures to be used or a wider variety of terrain to be covered. In addition, the overhead power transmission line may utilize relatively higher cost conductors only where needed, to reduce the cost of installing a new, higher cost overhead conductor.

The details of one or more embodiments of the invention are set forth in the accompanying drawings and the description below. Features, objects, and advantages of the invention will be apparent from the description and drawings, and from the claims.

DETAILED DESCRIPTION

Figure 1:
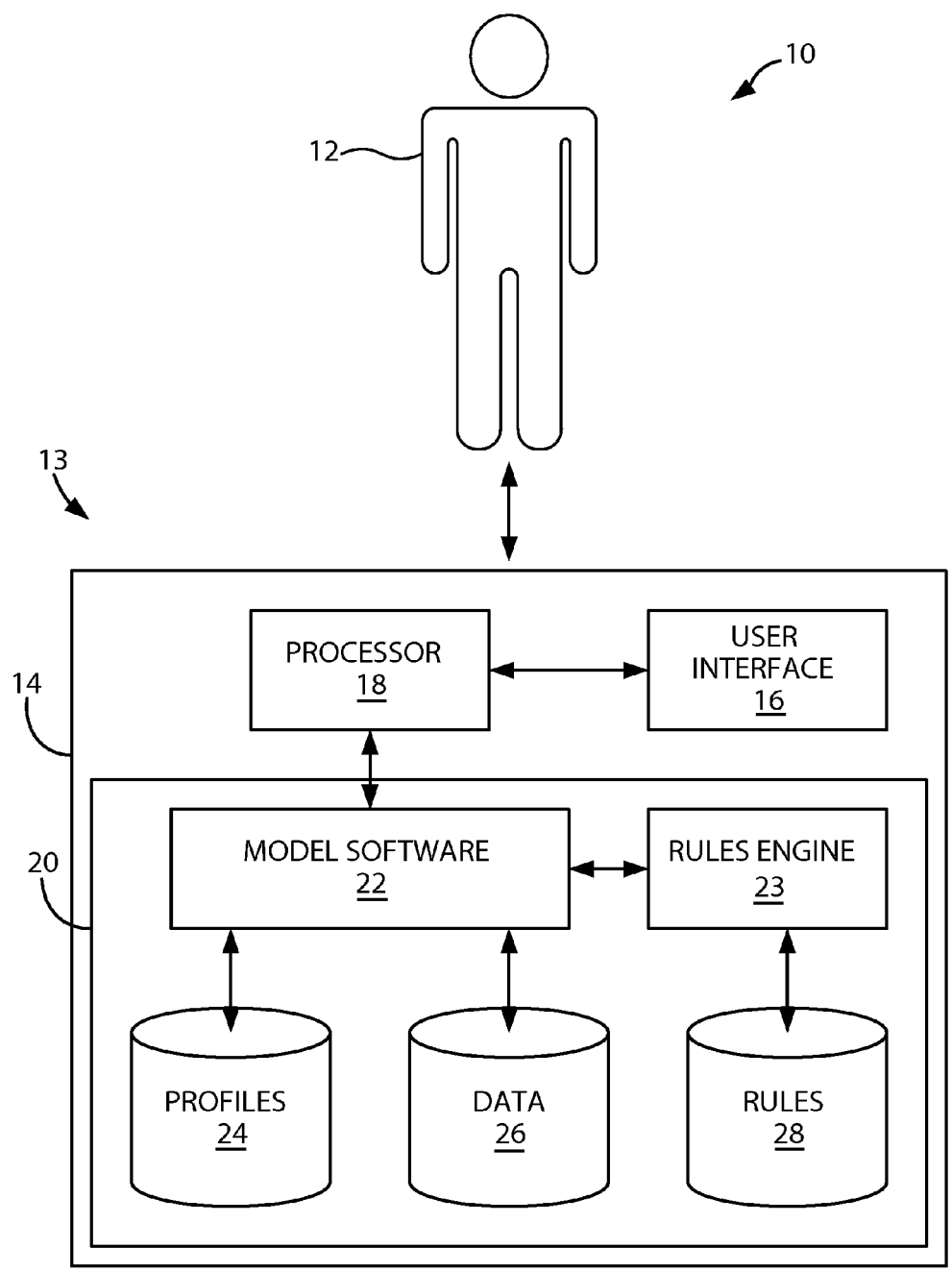
FIG. 1 is a block diagram illustrating a high-level view of an exemplary computerized conductor selection system.

An overhead power transmission line broadly encompasses the components between an electricity supply source and an electricity destination. One component of an overhead power transmission line is an electrical conductor. Typically, the conductor is a stranded overhead power transfer medium comprised of a plurality of wires twisted together. Other components of an overhead power transmission line include the structures (e.g., transmission towers and distribution poles) that support the elevated conductors and devices that insulate the conductor from the structures.

Conventionally, the overhead power transmission line tension section between two dead ends (e.g., terminating structures) is typically composed of one type of conductor. However, at least two different types of conductors may be joined together to form the entire overhead power transmission line tension section to provide design flexibility and benefits to the overhead power transmission line design between two deadends or between at least two tangent towers. Conductors of different types are defined herein as one conductor having at least one parameter different than at least one parameter of another conductor. Each conductor that makes up the overhead power transmission line tension section may be referred to as a tension subsection. Each tension subsection may end at towers or in the middle of a span between two adjacent towers. Different types of conductors may be used in one overhead power transmission line tension section when a repair is needed, the entire overhead power transmission line needs to be replaced, or a new overhead power transmission line needs to be designed. In one example, mixing different types of conductors may allow the overhead power transmission line to utilize conductors with lower sag characteristics in spans that require greater overhead clearance and conductors with higher sag characteristics in spans that do not have specific requirements such as overhead clearance. The resulting conductor configuration of the overhead power transmission line tension section may be less expensive or more effective than constructing the entire overhead power transmission line out of the low sag type of conductor. A conductor is defined by the type of materials, dimensions, electrical properties, and mechanical properties.

Selecting the most appropriate conductor configuration for the overhead power transmission line tension section may be a complicated exercise in considering many variables. In this manner, computer software programs may assist in meeting the requirements of the overhead power transmission line while fulfilling the desires of the user. The software programs may be simple spreadsheets, equation calculators, or full computational models that provide graphical representations of potential conductor configurations. These computer programs may also include performance and cost analyses of the potential conductor configurations that are used when selecting the most appropriate overhead power transmission line configuration.

Types of conductors used for overhead power transmission lines may vary widely between overhead power transmission line due to environmental conditions, electrical requirements, or cost limits. Some conductors may be constructed of steel cores, composite (e.g., aluminum matrix composite and polymeric composite) and Invar (i.e., an iron alloy comprising iron, nickel, and optionally other elements such as chromium, titanium, and carbon, wherein the iron alloy has a thermal expansion coefficient that is less than the linear combination of its constituents) cores, or any other cores commonly known in the art. Each span, or length of the overhead power transmission line tension section between two towers, may include a tension subsection that covers the entire span, and includes one conductor type or a tension subsection that includes multiple conductor types. Each span may cover a large distance (e.g., about 1250 feet (about 400 meters)), but other smaller or larger spans may be included in a designed overhead power transmission line tension section. These span lengths may be determined by the type or types of conductors used in the span. Other span lengths may be, for example, at least 30, 60, 90, 120, 150, 180, 210, 240, 270, 300, 600, 900, 1200, 1500, 1800, 2100, 2400, 2700 or even at least about 3,000 meters in length. Tower design may change depending on the length of a given span of the overhead power transmission line tension section.

FIG. 1 is a block diagram illustrating a high-level view of an exemplary computerized conductor selection system. Conductor selection system 13 includes computing device 14 that may be a computer that facilitates the selection of conductor configurations for user 12. Conductor selection system 13 includes user interface 16, processor 18, and memory 20. Memory 20 contains model software 22, rules engine 23, profiles 24, data 26, and rules 28. As shown in FIG. 1, system 10 includes a user 12 that interacts with conductor selection system 13. User 12 may be allowed to configure or adjust model software 22 and rules engine 23 according to the specific overhead power transmission line or preferences of the user. In addition, user interface 16 may allow user 12 to input geographic profiles (i.e., two-dimensional (2D) or three-dimensional (3D) geographic topology information) to profiles 24, conductor data to data 26, or selection rules to rules 28. Although the techniques are described with respect to conductor selection system 13, the technique may be applied manually by a human. In other words, the method of selecting a conductor configuration for an overhead power transmission line may be performed by user 12 without the use of a computerized conductor selection system 13.

User 12 may be any individual, company, power utility, or party who has an interest in the design of the overhead power transmission line and the selection of conductors for the overhead power transmission line to increase system performance or decrease the cost of the system. In one embodiment, user 12 is an employee of a manufacturing company that produces conductors suitable for overhead power transmission line applications. In this embodiment, user 12 may use conductor selection system 13 to identify possible conductor configurations for the overhead power transmission line and select the useful (including the most desirable or best) conductor configuration(s) for the specific system being designed. The useful (including the most desirable or best) system(s) may be determined as such according to user requests or preferences such as overhead power transmission line performance or total overhead power transmission line cost. In another embodiment, user 12 is a power company, utility, or other entity that makes decisions, or aids in making decisions, regarding power lines. In such an embodiment, user 12 may use conductor selection system 13 to understand which types of conductors could be used given various line preferences and geographical profiles. In another embodiment, user 12 is a third party that sells or assists in selling conductors.

Computing device 14 typically includes hardware (not all shown in FIG. 1) that may include at least one processor 18, memory 20 (e.g., random access memory), a device for reading computer-readable media (not shown), and user interface 16 that may include input/output devices such as a display, a keyboard, and a pointing device. Computing device 14 may be, for example, a workstation, a notebook computer, a personal digital assistant (PDA), a multimedia device, a network server, a mainframe or any other general-purpose or application-specific computing device. Although not shown, computing device 14 may also include other software, firmware, or combinations thereof, such as an operating system and other application software. Computing device 14 may read executable software instructions from a computer-readable medium (such as a hard drive, a CD-ROM, or a computer memory), or may receive instructions from another source logically connected to computer, such as another networked computer or server. Moreover, conductor selection system 13 may be distributed to execute on multiple computers, and may be used remotely by user 12 and accessible via a web browser or other interface.

In some embodiments, conductor selection system 13 may include more than one computing device, network connections, network servers, data repository, modeling environments, or any other electronic device that may be beneficial to the performance and operation of the conductor selection system. In other embodiments, conductor selection system 13 may require some calculations or decisions to be performed by user 12. These manual portions of conductor selection system 13 may be required due to user 12 preferences or special case scenarios that cannot be handled by the conductor selection system.

User interface 16 may take any form of interface that provides input/output capabilities. In one embodiment, the user interface is a graphical user interface (GUI), and may comprise, for example, various windows, control bars, menus, switches, radio buttons, or other mechanisms that facilitate presentation and reception of data and interaction with user 12. One common exemplary user interface is provided by Microsoft Corporation of Redmond, Wash. sold under the trade designation "WINDOWS OPERATING SYSTEM." Although described in various embodiments with respect to direct user interaction, user 12 may also remotely access conductor selection system 13 via a client device. For example, user interface 16 may be a web interface presented to a remote client device executing a web browser or other suitable networking software. Moreover, although described with respect to user 12, user interface 16 may be invoked by a software agent or other computing device remote to computer device 14. Additionally, in one embodiment, conductor selection system 13 may be invoked and utilized without a GUI, via an application programming interface (API) provided by the computing device 14.

In other embodiments, user interface 16 may provide 2D or 3D data for the geographical site to which the conductors are to be installed so as to allow user 12 to view possible conductor configurations of the overhead power transmission line. User interface 16 may also visualize the geographic profile and towers (structures) used to support the overhead power transmission line. The geographic profile describes a geographic region to which the overhead power transmission line is to be installed. From this visualization, user 12 may be able to identify conductor sag between towers and adjust the overhead power transmission line parameters (e.g., the transmission line input, used to create the conductor configuration). User interface 16 may additionally allow user 12 to view the effect of environmental forces on the overhead power transmission line before user 12 selects the conductor configuration to be used as the overhead power transmission line.

In some embodiments, user interface 16 may include more user friendly input devices that user 12 may use to interact with conductor selection system 13. For example, user interface 16 may provide a touch screen to receive user 12 touch directly when inputting conductor preferences or adjusting tower placement. Alternatively, user interface 16 may include a touch pad or drawing pad to receive user 12 input. In cases when at least two users 12 are concurrently using conductor selection system 13 from remote computing devices, user interface 16 may provide separate interfaces viewable by each user or a common interface in which control of the user interface may be exchanged between each user. In this manner, complex projects may be completed in less time and with greater success. In particular, this process may be useful in communication between the manufacturer and a client when designing the overhead power transmission line or between the manufacturer and installation site workers to troubleshoot problems in the field.

Processor 18 controls the flow of data between user interface 16 and memory 20. In some embodiments, processor 18 may separately communicate with the different elements of memory 20. Processor 18 retrieves instructions from model software 22 which may define possible conductor configurations for the overhead power transmission line based upon the preferences of the overhead power transmission line. Model software 22 utilizes data from several repositories in order to compute possible conductor configurations. These repositories include geographic profiles 24 and conductor data 26. In addition, rules engine 23 provides instructions to model software 22 that govern the possible conductor configurations according to selection rules 28. The data contained in geographic profiles 24, conductor data 26, and selection rules 28 may be pre-existing in memory 20 or provided by user 12.

It should be mentioned that the arrangement of components of conductor selection system 13 is only illustrative, and other arrangements or components may be provided to attain the same result as the example provided herein. For example, software modules may be greater in number and be accessed when necessary or data may be contained within separate memories such as hard disks, optical media, or networked storage devices.

Data defining conductors or suitable overhead power transmission line may include, for example, size, stranding, core fraction, diameter, resistivity, strength, a compressive stress parameter for the conductor's outer strands, compressive strain, associated stress/strain curves, ruling span, actual span, incline, and a number of ampacity conditions including ambient temperature, wind velocity, wind angle, emissivity, solar absorption, conductor elevation, conductor direction, latitude, total solar flux, sun time (time of day for solar radiation calculations), and atmosphere. Data defining overhead power transmission line preferences may be derived from the data describing the possible conductors, or may be a subset of the data describing the overhead power transmission line. For example, data defining overhead power transmission line preferences may include: maximum conductor diameter, maximum actual span sag, minimum emergency ampacity, maximum horizontal tension overall, maximum tension overall, maximum vertical tension overall, maximum horizontal tension at install, transverse tension, and maximum tension at install. Transverse tension is the force imposed on a conductor, usually by wind, transverse to the overhead power transmission line direction.

Additionally, various overhead power transmission line preferences may be specified as associated with at least one environmental scenario. An environmental scenario is data that defines an environmental condition that the overhead power transmission line may be exposed to in the operation in the field. Often these scenarios represent weather extremes the overhead power transmission line may encounter, as well as the environmental conditions at the time of installation. Environmental scenarios are defined by data such as ambient temperature, thickness of ice buildup, wind pressure, and National Electrical Safety Code overload factor, K. Each environmental scenario, then, may have with it its own set of overhead power transmission line preferences. For example, an environmental scenario may describe blizzard conditions with heavy ice buildup and wind. Line preferences, in terms of maximum horizontal tension, maximum tension, and maximum vertical tension, may be specifically associated with this environmental scenario. These environmental scenarios may eliminate certain conductor configurations from being acceptable to the overhead power transmission line design.

Data stored within memory 20, and its constituent databases or repositories, may be implemented in a variety of forms including data storage files, computer memory, or at least one database management system (DBMS) executing on at least one database server. The database management system may be a relational (RDBMS), hierarchical (HDBMS), multidimensional (MDBMS), object oriented (ODBMS or OODBMS) or object relational (ORDBMS) database management system. Data could, for example, be stored within a single relational database such as SQL Server from Microsoft Corporation. In one embodiment, the data is a flat file loaded into memory 20 of computing device 14. In another embodiment, the data, and particularly conductor data 26 is loaded into memory 20 of computing device 14.

Overhead power transmission line design, specifically the choice of a single type of conductor to carry electrical current, is typically facilitated with two distinct sets of known calculations. In some cases, overhead power transmission line design may be performed by at least one engineer or system designer. In other cases, the system design is facilitated by computer software programs. Initially, a first computer program utilizes a first set of calculations to determine ampacity of a given conductor. Ampacity is a calculation of current carrying capacity for a conductor, given conductor temperature, and given a set of weather conditions.

Stress/strain and sag/tension calculations may be performed with model software 22 to calculate sag of each span of the conductor configuration given the type of conductor's physical properties, and stress-strain behavior stored as conductor data 26. In one embodiment, stress/strain and sag/tension calculations utilize a method described in Overhead Conductor Manual, Southwire Company, 1994, the disclosure of which is herein incorporated by reference. Chen, S. Z., Black, W. A., Loard, H. W. Jr., "High Temperature Sag Model for Overhead Conductors," IEEE Transaction on Power Delivery, Vol. 17, No. 4, October 2002 describes a method combining ampacity and line sag calculations, and has a disclosure that is hereby incorporated by reference. In some embodiments, stress, strain and sag, and tension limitations may be regulated through rules engine 23 according to overhead power transmission line limits, tower limits, or other limiting factors.

Some conventional software programs perform only one of these two calculations, while others perform both. Examples of such conventional software programs include that marketed by ACA Conductor Accessories, Spartanburg, S.C., under the trade designation "SAG10", or that marketed by Power Line Systems, Inc., of Madison, Wis., under the trade designation "PLS-CADD", or that marketed by Pondera Engineers, Spokane, Wash., under the trade designation "TL-PRO DESIGN STUDIO."

Conductor data 26, in one embodiment, holds data defining each type of conductor and operating parameters for the types of conductors. Some conductors may be constructed, for example, of steel cores, composite (e.g., aluminum matrix composite and polymeric composite) cores, Invar cores, or any other cores commonly known in the art. Specific types of conductors may be constructed of aluminum matrix composite, polymeric composite, aluminum alloys, ceramics, boron, graphite, carbon, titanium, tungsten, and shape memory alloys. An example of a polymeric composite is aramid and poly(p-phenylene-2,6-benzobisoxazole). In addition, a conductor may be manufactured of any combination of these or other materials commonly known in the art. The conductor also includes stranded wires around the core, which are commonly made of an aluminum or copper alloy. However, conductor types referred to herein are generally referred to as the types of conductor cores within the conductor. A conductor having an aluminum matrix composite core is sometimes referred to as aluminum conductor composite reinforced ("ACCR").

Other exemplary overhead power transmission line conductors for tension subsections include: aluminum conductor steel reinforced (ACSR), thermal-resistant aluminum alloy conductor steel reinforced (TACSR), ultra thermal-resistant aluminum alloy conductor steel reinforced (ZTACSR), ultra thermal-resistant aluminum alloy conductor Invar reinforced (ZTACIR), heat resistant aluminum alloys (ZTAL), ultra thermal-resistant aluminum alloy conductor steel reinforced (ZTACSR), extra thermal-resistant aluminum alloy conductor steel reinforced (XTACSR), extra thermal-resistant aluminum alloy conductor Invar reinforced (XTACIR), gap type ultra thermal resistant aluminum alloy steel reinforced (GZ-TACSR), high strength thermal resistant aluminum alloy conductor steel reinforced (KTACSR), all aluminum conductor (AAC), all aluminum alloy conductor (AAAC), aluminum conductor composite core (ACCC), and aluminum conductor steel supported (ACSS). Additional types of conductors, types of materials used for conductors, methods for manufacturing tension subsections, methods of connecting tension subsections, types of overhead power transmission lines, and other related examples can be found in U.S. Pat. No. 7,547,843 (Deve et al.) and U.S. Pat. Application Pub. No. 2008/0156524 A1 (Jachim et al.), the disclosures of which are incorporated herein by reference.

In particular, conductor data 26 contains the exemplary data noted in Table 1 for each conductor that conductor selection system 13 will evaluate:

TABLE 1

| Data description | Example |
| --- | --- |
| Overall diameter | 0.724 inch (18.3 mm) |
| Kind of conductor (conductor family) | ACCR |
| Number of outer aluminum strands | 22 |
| Number of reinforcing strands | 7 |
| Aluminum wire diameter | 0.128 inch (3.25 mm) |
| Reinforcing wire diameter | 0.071 inch (1.8 mm) |
| Rated strength | 11084 lbs (5027 Kg) |
| Stress strain curve | 3477 |
| Weight | 0.381 lbs/ft (0.567 kg/m) |
| Resistance at 20° C. | 0.250 ohms/mile (0.155 Ohms/km) |
| Heat capacity core | 5.9 watt-sec/ft-° F. (19 watt-sec/m-° C.) |
| Heat capacity outer aluminum | 143.3 watt-sec/ft-° F. (400 watt-sec/m-° C.) |

Conductor data 26, in one embodiment, may also contain stress strain information for every stress strain curve cross-referenced to each type of conductor. For example, using the exemplary data in Table 1 (above), the conductor type ACCR has stress strain curve of 3477. This number is used to look up further information corresponding to the stress strain information. The stress strain information generally contains a list of polynomials, core fractions, and thermal elongation properties for a stress strain curve. Stress strain curve information is available from conductor manufacturers, and is usually determined via a well known process, an implementation of which is described in Aluminum Association Guide, Rev. 1999, "A Method of Stress-Strain Testing of Aluminum Conductors and ACSR and A Method for Determining the Long Time Creep of Aluminum Conductors in Overhead Line." The particular information contained in the stress strain database in one exemplary embodiment is as represented in Table 2 (below):

TABLE 2

| Data Descriptor | Example |
|---|---|
| Stress strain curve number | 3477 |
| Fmodel | 0.14 |
| Test temperature | 21.67° C. |
| Ai0 | 17 |
| Ai1 | 53996 |
| Ai2 | −10455 |
| Ai3 | −148929 |
| Ai4 | 165944 |
| A final modulus | 75865 |
| Af0 | 0 |
| Af1 | 25963 |
| Af2 | −3374 |
| Af3 | 135876 |
| Af4 | −292137 |
| Acte | 0 |
| Ri0 | −131 |
| Ri1 | 53268 |
| Ri2 | −55226 |
| Ri3 | 120092 |
| Ri4 | −85520 |
| R final modulus | 46093 |
| Rf0 | −131 |
| Rf1 | 53268 |
| Rf2 | −55226 |
| Rf3 | 120092 |
| Rf4 | −85520 |
| Modulus aluminum | 8960710 |
| Modulus core | 54100000 |
| CTE aluminum | 0.000023 |
| CTE core | 0.00000635 |

Ai0 is the zeroth order coefficient to the aluminum stress strain curve for initial loading (i.e., "A" stands for aluminum, "i" stands for initial loading, and "0" stands for zeroth order). Likewise, Rf3 is the third order coefficient for the reinforcing core, for final loading.

In one embodiment, described curves from Table 2 (above) will be used by model software 22 to solve a nested set of 4th order polynomials for each type of conductor and environmental condition to create potential conductor configurations. One nonlinear solution process is described in "Overhead Conductor Manual," Southwire Company, 1994, the disclosure of which is hereby incorporated by reference. In alternative embodiments, the stress strain information, such as shown in Table 2 (above), may be stored in a separate repository from conductor data 26.

User 12 may provide preferences as to how many different conductor configurations conductor selection system 13 creates. For example, user 12 may specify that the five most optimal conductor configurations are presented via user interface 16. Alternatively, user 12 may request that the five least expensive options may be presented. From this limited set of conductor configurations, user 12 may use judgment in selecting the useful (including the most desirable or best) conductor configuration(s) for the overhead power transmission line. User 12 may also be able to select one of the provided conductor configurations and request that conductor selection system 13 provide more conductor configurations in close relation to the selected conductor configuration. In other embodiments, conductor selection system 13 may be configured such that only the best conductor configuration, as determined by the conductor selection system, is presented to user 12. This method may be beneficial when conductor selection system is used by an inexperienced user.

Conductor selection system 13 may include an error handling mechanism for identifying discontinuous data or scenarios in which no feasible conductor configurations can be created. These instances may occur when the geographic profile information or overhead power transmission line input defines limitations on the overhead power transmission line that cannot be satisfied. The data may be prescreened for these inconsistencies or the error messages may be provided when the data is processed and no possible conductor configurations can be provided. In alternative embodiments, warning messages may be provided when possible problems occur due to overhead power transmission line changes. These changes such as aging or environmental extremes could cause problems with the multiple types of conductors within the conductor configurations.

During operation of conductor selection system 13, user 12 is then presented with user interface 16 facilitating the entry of information defining preferred overhead power transmission line parameters. Common inputs in user interface 16 may define overhead power transmission line parameters ruling span, actual span, and incline between each tower of the overhead power transmission line. The ruling span is the characteristic span over the length of the overhead power transmission line. The ruling span for an overhead power transmission line tension section can be calculated by the following equation:

$$\text{ruling span} = \sqrt{\frac{\sum_{\# \text{ of spans}} \text{span}^3}{\sum_{\# \text{ of spans}} \text{span}}}$$

Actual span is a physical span within an overhead power transmission line tension section for which the ruling span was calculated. Sag values are calculated based on the actual span. Incline, an optional parameter, is used if the actual span is not level. Incline is, in one embodiment, measured from a first end to a second end for each overhead power transmission line tension section between two dead ends. In this manner, each overhead power transmission line tension section should be calculated in the same manner to provide continuous data.

In some cases, the optimal, or best, configuration of conductors that conductor selection system 13 suggests may not be the most desirable solution. Conductor selection system 13 may also calculate and save every conductor in the database that met the overhead power transmission line preferences of user 12, ranked by design goal. In one embodiment, these alternatives may be reviewed by user 12 through interaction with user interface 16.

Evaluation priorities, in one embodiment, are selected by user 12 from a pre-defined pull-down menu. These priorities may be predetermined in rules 28 or input into rules 28 for the overhead power transmission line being designed. In one example, the conductors are evaluated and presented in a manner such that ampacity is the most important constraint, sag is the second most important, and conductor area is the third more important. Possible cases are specified in Table 3 (below) as examples:

TABLE 3

| Case | First Priority | Second Priority | Third Priority |
|------|---------------|-----------------|----------------|
| 1 | Ampacity | Sag | Area |
| 2 | Ampacity | Area | Sag |
| 3 | Sag | Ampacity | Area |
| 4 | Sag | Area | Ampacity |
| 5 | Area | Ampacity | Sag |
| 6 | Area | Sag | Ampacity |

The design goals, or priorities, specified by user determine the case. Each case defines the manner in which model software 22 will evaluate conductors. Each case invokes a common set of subroutines, but does so in different orders and frequencies. Many different evaluation techniques may be employed depending upon the design goal of each overhead power transmission line case. These evaluation techniques may be preset within model software 22 or user configured in order to correctly evaluate different conductor configurations of the overhead power transmission line.

In addition, some cases may include more ordered steps or preferences to determine possible conductor configurations. Additional or replacement parameters may include overhead power transmission line cost, installation time, overhead power transmission line product life, or other parameters that are not associated with physical properties of the conductor configuration selected. These non-physical preferences, in some cases, may be paramount to the desired selection of a conductor configuration within configurations that satisfy physical and performance preferences. Rules engine 23 may utilize preferences stored rules 28 such that conductor selection system 13 may be able to provide user 12 with the most likely desired conductor configuration. However, user interface 16 may allow user 12 to override the rules engine 23 to select the desired conductor configuration.

In other embodiments, conductor selection system 13 may present a preliminary list of conductor configurations based upon a limited number of calculations and preferences. User 12 then interacts with user interface 16 to select a smaller number of conductor configurations for processor 18 to consider using the full parameters of model software 22. Therefore, user 12 may bypass long wait times for conductor selection system 13 to process the complete parameters for conductor configurations that the user is not interested in pursuing.

Alternatively, conductor selection system 13 may go through an iterative process that guides user 12 through the conductor selection process in multiple steps. In this manner, each step may narrow the number of conductor configurations according to the preferences of user 12. The step order may be pre-determined by rules engine 23 or customized by user 12. Conductor selection system 13 may allow user 12 to return to previous steps if a series of selections results in no conductor configurations that meet specifications and preferences of the user. Model software 22 may calculate possible conductor configurations ahead of each step of user 12 and prevent the user from continuing forward when no conductor configurations will be possible.

An iterative process by conductor selection system 13 may be similar to a decision tree type of process where each step proceeds to another step with more selections possible to further define the conductor configuration. Some steps may have only one possible selection while other steps may have at least ten selections for user 12. In some embodiments, user 12 may request conductor selection system 13 to automatically make the next selection based upon rules 28 or the number of possible conductor configurations that will be available after the selection.

Conductor selection system 13 may be configured differently in embodiments other than described herein and still utilize the general method of selecting conductor configurations for an overhead power transmission line. Conductor selection system 13 may employ more or less software programs, data repositories, or processing hardware in order to assist user 12 in selecting the most appropriate conductor configuration. As described herein, conductor selection system 13 may be completely automated to provide one conductor configuration to user 12 or allow the user control over each step of the selection process. In any case, conductor selection system may allow user 12 to efficiently find the useful (including the most desirable or best) conductor configuration(s) for an overhead power transmission line over existing or newly designed towers in an overhead power transmission line.

Figure 2:
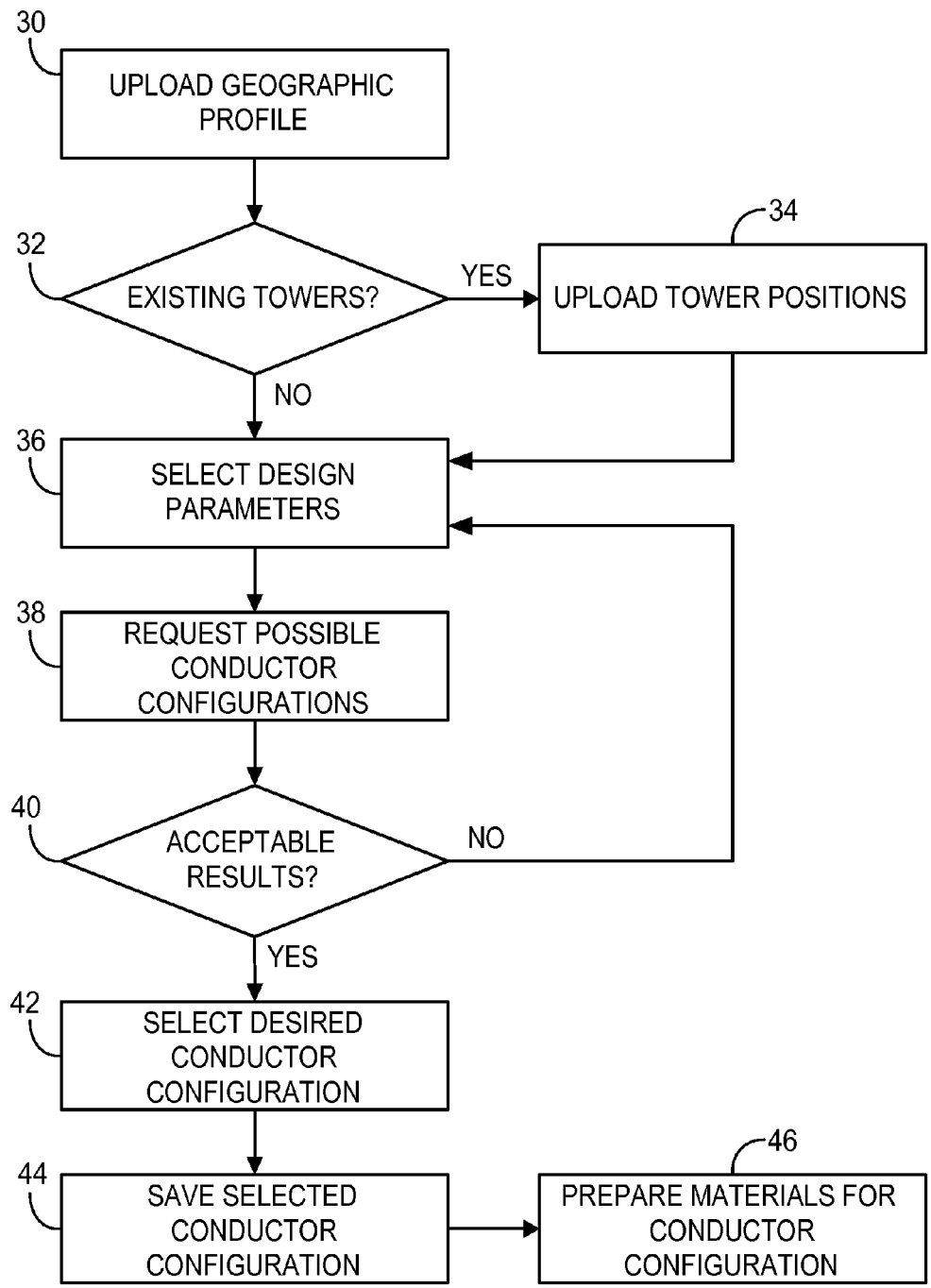
FIG. 2 is a flow diagram illustrating an example method for selecting an appropriate conductor configuration of an overhead power transmission line.

FIG. 2 is a flow diagram illustrating an example automated method for selecting an appropriate conductor configuration of an overhead power transmission line. As shown in FIG. 2, user 12 begins the conductor selection process by uploading the geographic profile of the terrain over which the new overhead power transmission line will be installed (30). The profile may be uploaded as data through any type of computer-readable medium or input manually into conductor selection system 13. Processor 16 next prompts user 12 if there are existing towers in the overhead power transmission line (32). If there are at least one existing tower that will be used with the new overhead power transmission line, user 12 uploads the tower positions and types to system 13 (34). If there are no existing towers, the conductor selection process continues.

User 12 next selects design parameters for the overhead power transmission line that limits the possible conductor configurations (36). Some design parameters may already be pre-determined, but may be revised by user 12. User 12 then requests conductor selection system 13 to provide possible conductor configurations according to the design parameters (38). If the results are not acceptable to user 12 (40), the user selects new design parameters (36). If the results are acceptable (40), user 12 selects the desired conductor configuration out of the configurations provided by system 13 (42).

Conductor selection system 13 next saves the selected conductor configuration for later retrieval by user 12 or another user involved in the design, production, or installation of the overhead power transmission line defined by the conductor configuration (44). User 12 may then use the selected conductor configuration to prepare the materials, schedule, and other needs in order to install the overhead power transmission line and complete the overhead power transmission line (46).

In other embodiments, the conductor selection system may include more steps when user 12 invokes a more step-by-step or iterative selection process as described in FIG. 1. In these cases, the method may involve more steps. Alternatively, the process may change slightly depending upon who user 12 is. For example, if user 12 is a customer of the manufacturer, the user may need to provide additional information and be restricted from changing some pre-defined parameters for the overhead power transmission line. Conversely, if user 12 is an engineer for the manufacturer, the user may have complete control over the aspects of conductor selection system 13.

Figure 3:
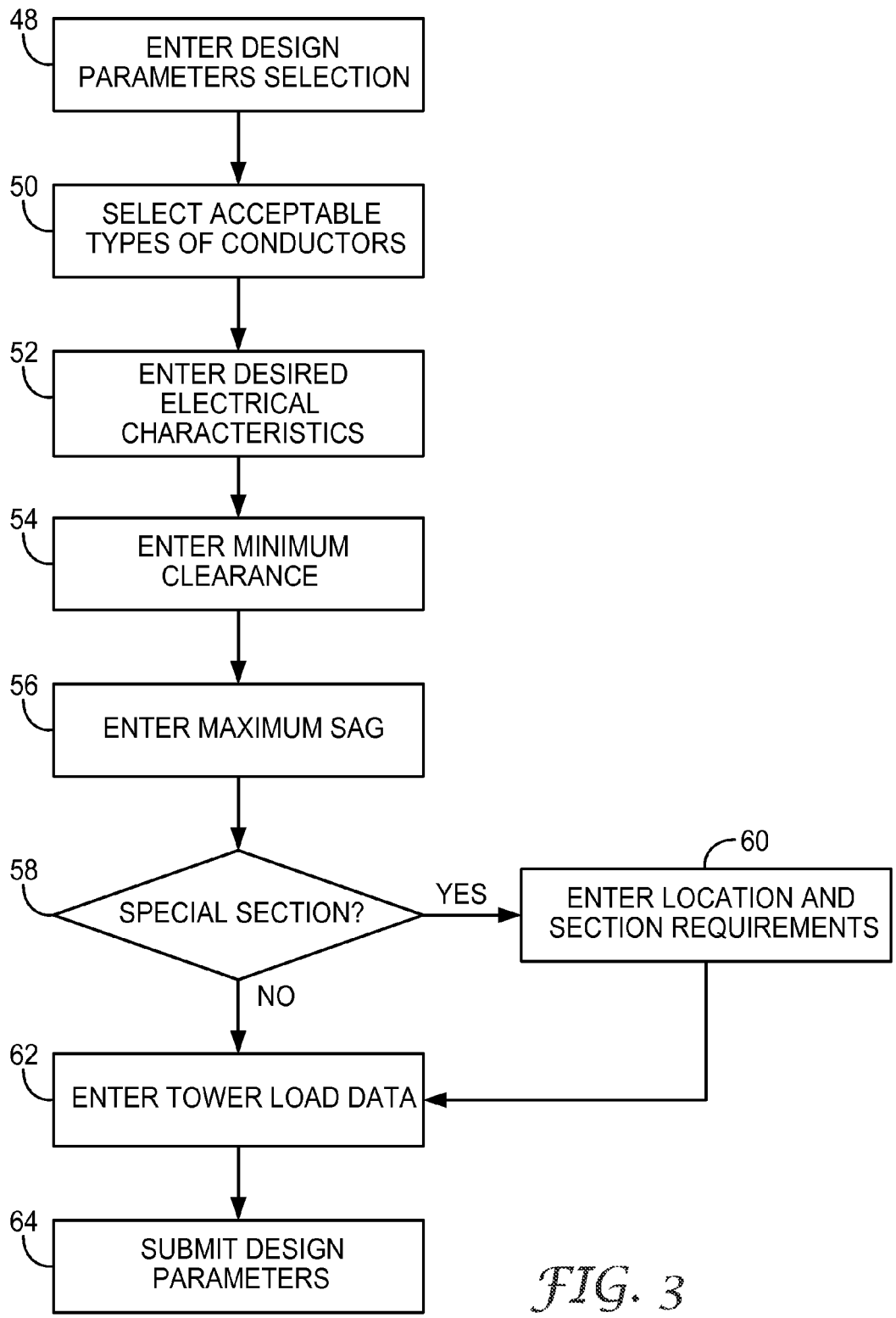
FIG. 3 is a flow diagram illustrating an example method for entering design parameters for selecting an appropriate conductor configuration of an overhead power transmission line.

FIG. 3 is a flow diagram illustrating an example method for entering design parameters for selecting an appropriate conductor configuration of an overhead power transmission line.

As shown in FIG. 3, user 12 is brought through steps for entering design parameters of the overhead power transmission line tension section to include multiple types of conductors (48). User 12 may select all of the acceptable types of conductors that may be considered for the conductor configuration (50). User 12 may enter all acceptable conductors, or only two conductors that are available according to the particular project in question. User 12 next enters the desired electrical characteristics of the resulting conductor configuration of the overhead power transmission line tension section (52) and the minimum clearance of the overhead power transmission line tension section above the ground (54). In addition, user 12 enters the maximum sag that any span of the overhead power transmission line tension section may allow (56).

If there is a special span of the overhead power transmission line tension section that needs specific consideration (58), user 12 enters the location of the span in the overhead power transmission line tension section and the preferences or parameters of the particular span (60). These spans of the overhead power transmission line tension section may be over a river, over a building, under airplane traffic, or near any other type of circumstance. If there are no special spans (58), user 12 enters the tower load data for the existing or new towers that will support the overhead power transmission line tension section (62). In some embodiments, user 12 may only need to enter the type of towers that will be used, and the actual tower load data may be retrieved by processor 16 from data 26 or a different networked repository. Once all the data is entered, user 12 may submit the entered design parameters to conductor selection system 13 (64).

In other embodiments, the method of FIG. 3 may be arranged in a different manner, as the sequence of entered parameters may not matter to the selection of possible conductor configurations. In addition, more or less design parameters may be selected by user 12, depending on the configuration of conductor selection system 13.

Figure 4:
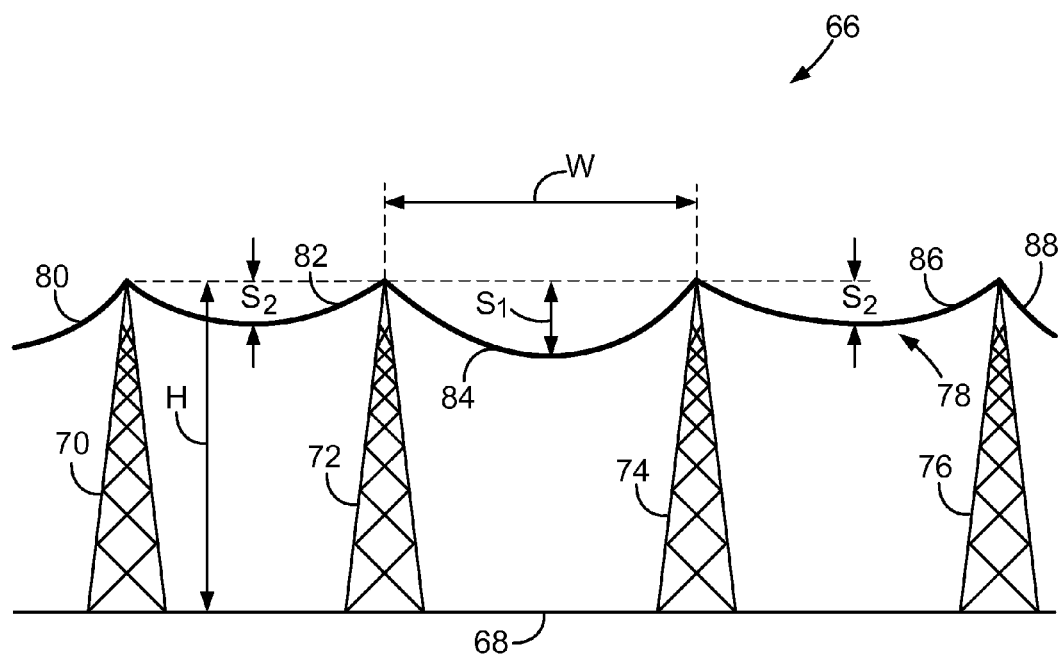
FIG. 4 is a conceptual diagram illustrating example conductors of an overhead power transmission line tension section between towers on a level geographic profile.

FIG. 4 is a conceptual diagram illustrating example conductors of an overhead power transmission line tension section between towers on a level geographic profile. As shown in FIG. 4, a portion of an overhead power transmission line 66 is shown to include overhead power transmission line tension section 78, supported by towers 70, 72, 74, and 76 over geographic profile 68 (i.e., the ground). Overhead power transmission line tension section 78 includes multiple conductors (which are each a tension subsection), of which conductors 80, 82, 84, 86, and 88 are shown. In some embodiments, a tension subsection may extend beyond just one span and couple to another tension subsection within a span instead of at a tower. Each tower has a height H and each span has a width (i.e., span distance W) and sag $S_1$ and $S_2$, between the respective towers. The span distance W is the horizontal distance between consecutive towers, and the sag refers to the distance between the right attachment point to the lowest point of the overhead power transmission line tension section within the span. Geographic profile 68 is generally flat, but sag $S_1$ and $S_2$ are different in each respective span of overhead power transmission line tension section 78. In some embodiments, $S_1$ and $S_2$ may be equivalent throughout the overhead power transmission line tension section.

In the example of FIG. 4, consecutive spans of overhead power transmission line tension section 78 are made of alternative types of conductors. Conductors 80, 84, and 88 are steel reinforced conductors that are slightly heavier than conductors 82 and 86. Throughout the length of overhead power transmission line tension section 78, these conductors alternate between each tower in overhead power transmission line 66.

Conductors 80, 84, and 88 are constructed of steel and are heavier than conductors 82 and 86, which are constructed of a lighter composite material, such as ACCR described above. Therefore, sag $S_2$ of low-sag conductors 82 and 86 is smaller than sag $S_1$ of conductors 80, 84, and 88.

The conductor configuration of overhead power transmission line tension section 78 may be beneficial because low-sag, and relatively higher cost, conductors 82 and 86 may reduce the energy loss between the two dead ends of overhead power transmission line 86 without having to use the more expensive conductors 82 and 86 throughout the entire overhead power transmission line tension section 78. In addition, low-sag conductors 82 and 86 may be positioned in system 66 above structures or areas that require greater clearance over geographic profile 68.

The dead-end towers (structures) allow for generally no longitudinal movement of the conductor. In between the dead-end structures, suspension structures support the conductor vertically. The conductor is connected to the suspension tower via an insulator string (typically strung-together insulated ceramic discs). One end of the insulator string is attached to the suspension tower and the other end of the insulator string is attached to the conductor. This latter attachment is referred to as the conductor attachment point. As changes in tension occur in the conductor, the insulator string, pivoting around the suspension tower attachment site, will pull on the conductor and longitudinally move the conductor attachment point to balance the ensuing forces. This movement is referred to as insulator swing. Changes in conductor tension between spans on a suspension tower are normally equalized by insulator swing. The insulator swings from the lower-tension span towards the higher-tension span to equalize the tension between spans. This causes the tension to drop in the higher-tension span increasing sag in that span. One example of this is that the center of balance of the overhead power transmission line tension section at the tower resides at the center of the tower instead of to one side of the tower. With other types of conductors, $S_1$ and $S_2$ may be very similar in cases where the weight of each conductor is almost equivalent. While overhead power transmission line tension section 78 includes alternating types of conductors, the configuration may alternatively include conductor types that alternative every at least two spans, or partial spans covered by the conductor in the respective tension subsection. Conductor selection system 13 provides the information and tools to user 12 to investigate all possible conductor configurations with the design parameters and preferences that the user provides.

In other embodiments, span distance W may be customized for each tension subsection that is used within overhead power transmission line tension section 78. For example, W between towers 72 and 74 may be less than W between towers 70 and 72. Low-sag conductor 82 may allow the span distance, W, between towers 70 and 72 to be increased because of the reduced weight that the towers need to support. In this case, fewer towers may be needed to support overhead power transmission line tension section 78. The fewer towers may reduce installation and maintenance costs without investing in conductors 82 throughout the entire overhead power transmission line tension section 78. Fewer towers may also reduce the environmental impact and improve aesthetics of the entire overhead power transmission line with fewer towers in residential areas. These possibilities may be presented to user 12 based upon the preferences provided to conductor selection system 13. As mentioned previously, each span distance W may be determined with conductors (tension subsections) of the overhead power transmission line tension section that extend beyond one span.

Figure 5:
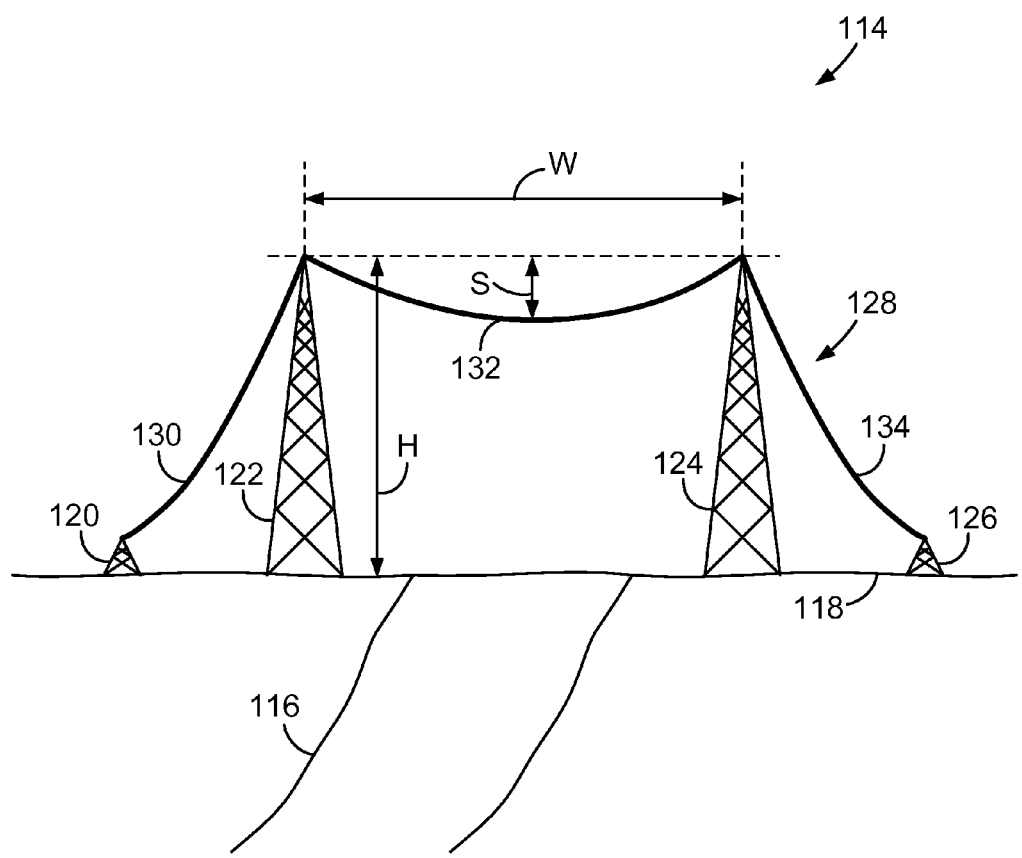
FIG. 5 is a conceptual diagram illustrating example conductors of an overhead power transmission line tension section between towers on either side of a river with adjacent dead ends.

FIG. 5 is a conceptual diagram illustrating example conductors of an overhead power transmission line tension section between towers on either side of a river with adjacent dead ends. As shown in FIG. 5, overhead power transmission line 114 includes overhead power transmission line tension section 128 supported by towers 120, 122, 124, and 126 over river 116 and geographic profile 118. Towers 120 and 126 are the dead-ends and towers 122 and 124 support the high span of conductor 132 to allow desired or required clearance over river 116. Conductors 130, 132, and 134 of overhead power transmission line tension section 128 have insulator strings (not shown) of each towers 122 and 124 that may swing away from the center of each respective tower to equal the tension on either side of the insulators. The span between towers 122 and 124 may be considered a special span that has specific preferences entered into conductor selection system 13 by user 12. In some embodiments, a conductor of overhead power transmission line tension section 128 may extend beyond just one span and couple to another conductor within a span instead of at a tower. For example, the tension subsection that includes conductor 132 may extend beyond one or both of towers 120 and 126.

Conductors 130 and 134 are heavy steel conductors that are inexpensive and aid in supporting the span of conductor 132. Conductor 132 is constructed of the lighter weight ACCR composite in order to reduce the tension on towers 122 and 124 while minimizing the height of sag S. Allowing the insulators to swing away from center in overhead power transmission line tension section 128 may allow a user 12 to keep the desired or required clearance over river 116 while using towers 122 and 124 with smaller height H. System 114 may take less time to install while reducing installation and maintenance costs because multiple types of conductors were used in overhead power transmission line tension section 128.

In other embodiments, river 116 may be another body of water, a multi-lane highway, a canyon, or any other large span distance W that must be covered. Traditional overhead power transmission line tension sections that can only utilize one type of conductor, with towers 122 and 124 having height H may need to be higher to cover span distance W or, in some cases, overhead power transmission line tension section 128 may not be able to be built over a large span distance. With increasing energy demand and aging power grid infrastructure, overhead power transmission line tension section 128 that utilizes more than one type of conductor may reduce the costs associated with installing and maintaining overhead power transmission lines while allowing greater flexibility in designing overhead power transmission line solutions.

Figure 6:
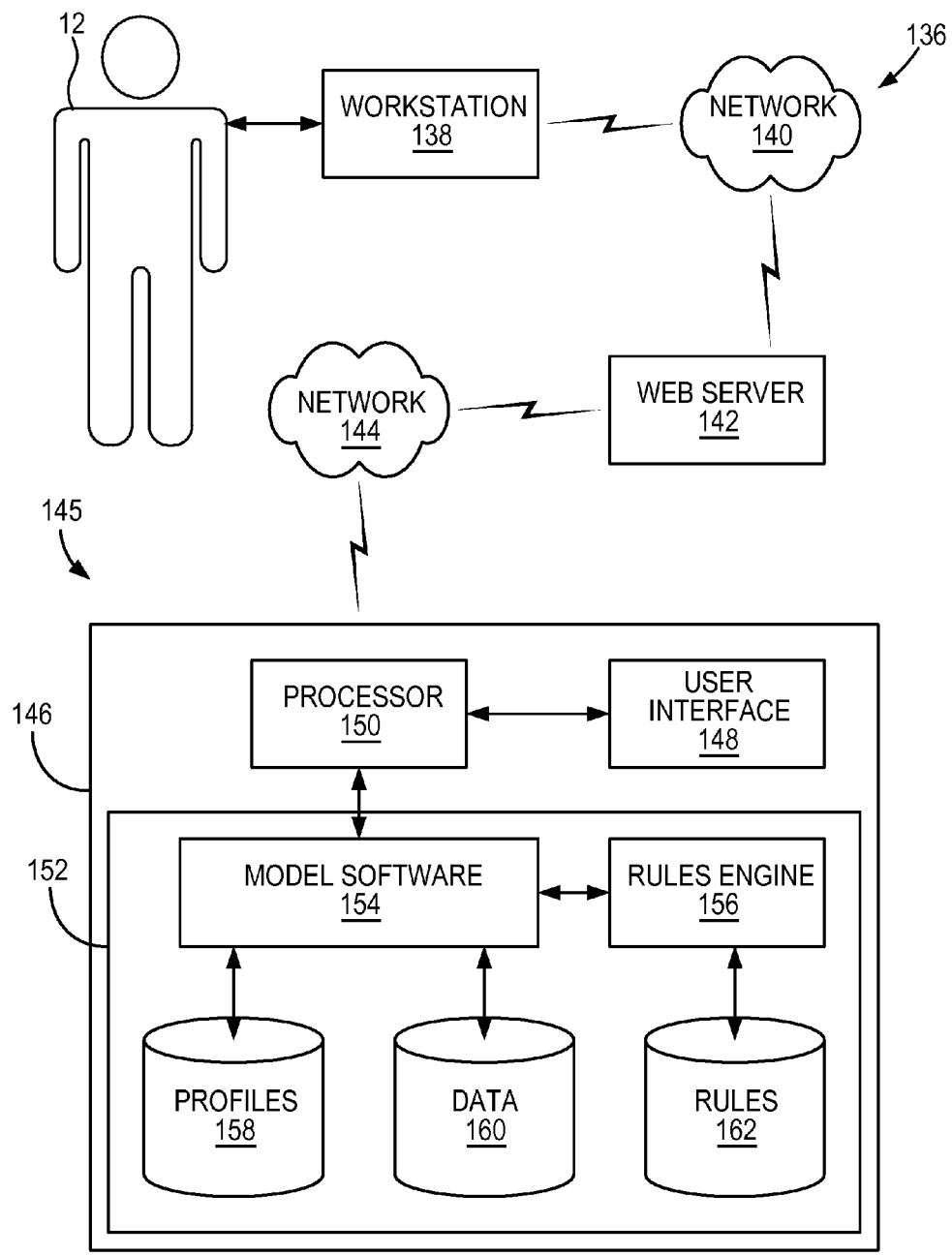
FIG. 6 is a block diagram illustrating a high-level view of an exemplary computerized conductor selection system using a remote workstation.

FIG. 6 is a block diagram illustrating a high-level view of an exemplary computerized conductor selection system using a remote workstation. As shown in FIG. 6, system 136 is similar to system 10 of FIG. 1 with user 12 interacting with conductor selection system 145 remotely through some type of network connection. User 12 interacts with workstation 138, and workstation 138 communicates with network 140, web server 142, network 144, and finally conductor selection system 145. Conductor selection system 145 may include computing device 146 which houses user interface 148, processor 150, and memory 152. Memory 152 is substantially similar to memory 20 and includes model software 154 and rules engine 156. Memory 152 also includes the repositories of geographic profiles 158, conductor data 160, and selection rules 162. In some embodiments, repositories 158, 160 and 162 may be accessed through network 144 instead of being included in memory 152. System 136 allows user 12 to input preferences for selecting a conductor configuration, and some security measures may prevent an unauthorized remote user from accessing or modifying certain aspects of conductor selection system 145.

Similar to FIG. 1, user 12 may be any individual, company, power utility, or party who has an interest in the design of the overhead power transmission line and the selection of conductors for the overhead power transmission line to increase system performance or decrease the cost of the system. User 12 will need a password, biometric, or other authentication key to pass through the security measures of at least one of workstation 138, web server 142, and conductor selection system 145. In some embodiments, there may be levels of users which separate novice, advanced, and administrative type users.

Particularly, FIG. 6 shows a client/web server/application server environment where the user is a customer, potential customer, or other third party that wishes to evaluate conductors. User 12 interacts with workstation 138 (e.g., a computing device), and connect to a web server 142 via network 140, which could be the Internet. Web server 142 could be, one such as that marketed by Microsoft Corporation under the trade designation "INTERNET INFORMATION SERVER." It could also be a web server such as that marketed by Apache Foundation under the trade designation "APACHE WEB SERVER." In this example, web server 142 provides user interface components that facilitate gathering and presenting information similar to that as was described with respect to user interface 16. Web server 142 may be attached, via a network such as network 144, to computing device 146, which hosts an implementation of conductor selection system 145. In another embodiment, web server 142 and computing device 146 are on the same system. In another embodiment, repositories 158, 160 and 162 are on separate servers or computing devices, attached to computing device 146 via network 144 or another similar network.

In the example shown, system 136 enables multiple parties to contribute to the design and installation of an overhead power transmission line. Since overhead power transmission lines may be large projects that may include private and government entities, allowing access to conductor selection system 145 may be beneficial to efficient design and implementation of overhead power transmission lines. In addition, third party manufactures of other conductors, conductor components, structures, insulators, and other equipment may have some type of access to conductor selection system 145 in order to identify incompatibilities in components and modify current components to allow further design possibilities.

While system 136 allows conductor selection system 145 to be utilized over a network, all functions are similar to those of system 10 as described above. In addition, system 136 may be able to be networked with other databases or data repositories to include the most updated data for conductors and all other types of components of the overhead power transmission line. This data may include survey data for geographical profiles 158. For example, user 12 may enter the coordinates of existing towers or preferred towers, and conductor selection system 145 for retrieval of elevation data for all tower locations and compilation of all this data for use by model software 154 in generating possible conductor configurations.

Alternative arrangements of components in system 136 are contemplated in enabling the features of conductor selection system 145. For example, more or less networks, computing devices, or data repositories may be implemented to achieve the advantages described herein.

Figure 7:
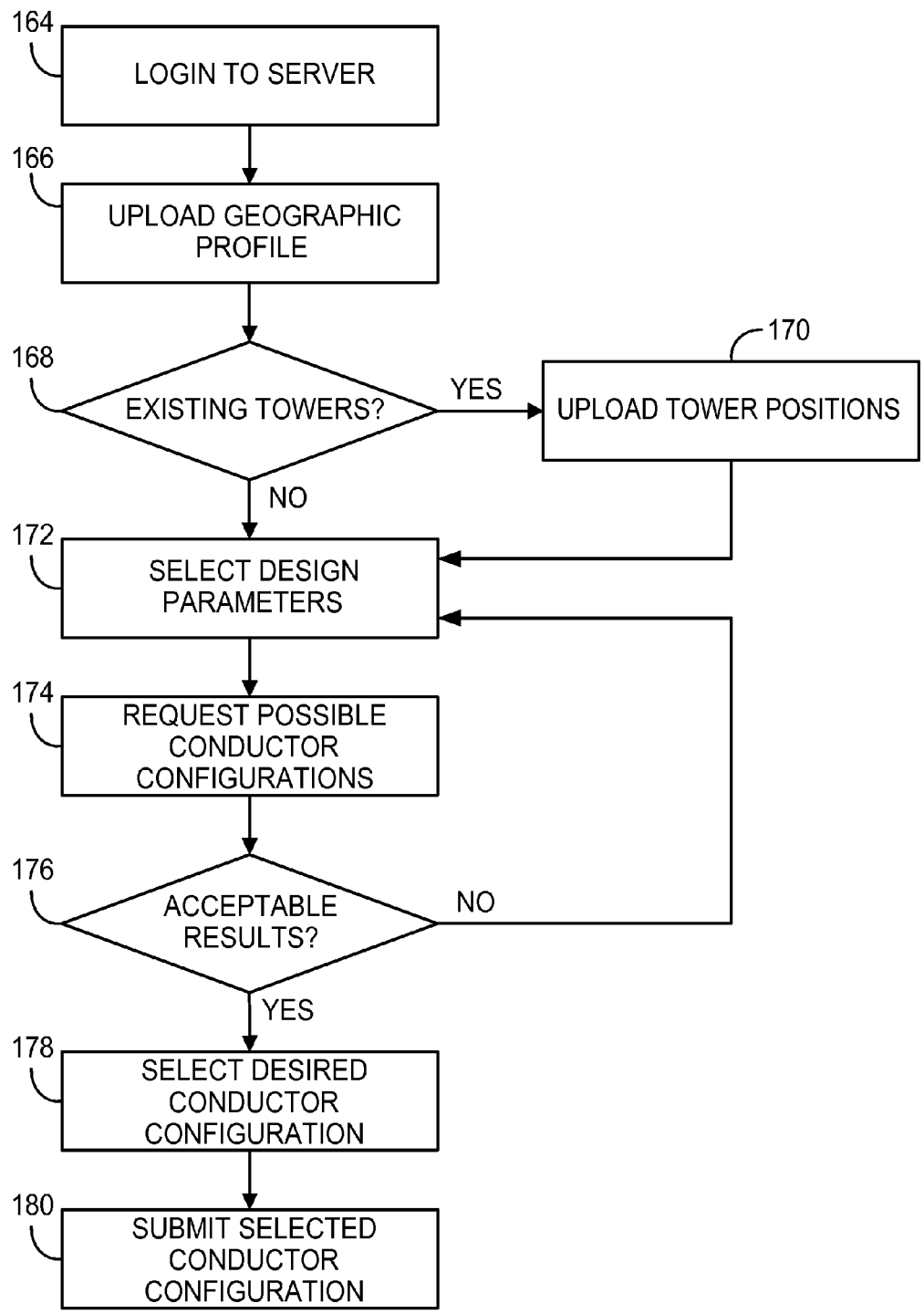
FIG. 7 is a flow diagram illustrating an example method for selecting an appropriate conductor configuration of an overhead power transmission line using a remote workstation.

FIG. 7 is a flow diagram illustrating an example method for selecting an appropriate conductor configuration of an overhead power transmission line using a remote workstation. User 12 begins to access conductor selection system 145 by first logging in to the web server 142 (164). User 12 next uploads the geographic profile for the overhead power transmission line (166). If there are existing towers for the system (168), user 12 is prompted to upload tower positions (170). If there are no existing towers (168), the process continues.

User 12 next selects design parameters for the overhead power transmission line that limit the possible conductor configurations (172). Some design parameters may already be pre-determined, but may be revised by user 12 if the user has authority to do so. User 12 then requests conductor selection system 136 to provide possible conductor configurations according to the design parameters (174). If the results are not acceptable to user 12 (176), the user selects new design parameters (172). If the results are acceptable (176), user 12 selects the desired conductor configuration out of the configurations provided by system 136 (178).

User 12 next submits the selected conductor configuration to be saved for later retrieval by user 12 or another user involved in the design, production, or installation of the overhead power transmission line by the conductor configuration to include the multiple tension subsections of each conductor (180). User 12 may then use the selected conductor configuration to prepare the materials, schedule, and other needs in order to install the overhead power transmission line and complete the overhead power transmission line.

In other embodiments, the conductor selection system may include more steps when user 12 invokes a more step-by-step or iterative selection process as described in FIG. 1 according to system 136 of FIG. 6. In these cases, the method may involve more steps. Alternatively, the process may change slightly depending upon who user 12 is. For example, if user 12 is a customer of the manufacturer, the user may need to provide additional information and be restricted from changing some pre-defined parameters for the overhead power transmission line. Conversely, if user 12 is an engineer for the manufacturer, the user may have complete control over the aspects of conductor selection system 136.

Figure 8:
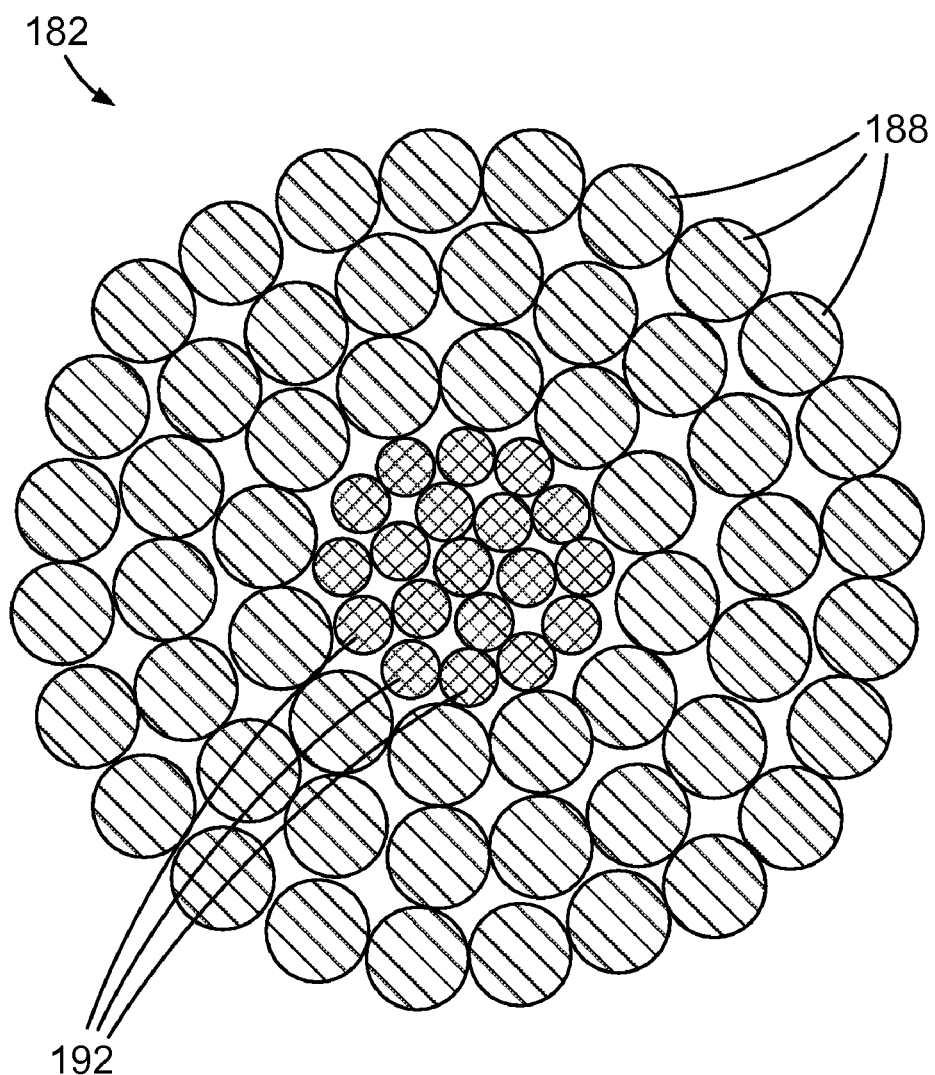
FIG. 8 is a cross-section of an exemplary conductor of an overhead power transmission line.

FIG. 8 is a cross-section of an exemplary conductor of an overhead power transmission line. Some conductors may be constructed of steel cores, composite (e.g., aluminum matrix composite and polymeric composite) cores, Invar cores, or any other cores commonly known in the art. Specific types of conductors may be constructed of aluminum matrix composite, polymeric composite, aluminum alloys, ceramics, boron, graphite, carbon, titanium, tungsten, and shape memory alloys. An example of a polymeric composite is aramid and poly(p-phenylene-2,6-benzobisoxazole). In addition, a conductor may be manufactured of any combination of these or other materials commonly known in the art that have a low coefficient of thermal expansion. The conductor also includes stranded wires around the core, which are commonly made of an aluminum or copper alloy. However, conductor types referred to herein are generally referred to as the types of conductor cores within the conductor. While any type of conductor may be used to construct each tension subsection of an overhead power transmission line tension section between two dead-end towers, an example conductor (i.e., an ACCR conductor) is described herein to illustrate components of one type of conductor for an overhead power transmission line. As shown in FIG. 8, exemplary overhead electrical power transmission conductor 182 may have a core of nineteen individual wires (e.g., composite (e.g., metal matrix composite) wires) 192 surrounded by fifty-four individual metal wires (e.g., aluminum or aluminum alloy wires) 188. Overhead electrical power transmission conductor 182 is a composite conductor such as an ACCR conductor. Conductor 182 includes current carrying wires 188 and core wires 192. Wires 188 may be constructed of a material that conducts electrical current, such as an aluminum and zirconium alloy. Core wires 192 each contain a plurality of fibers that provide wire strength. Wires 192 may be constructed of a composite material.

Conductor 182 has substantially continuous (e.g. the length is relatively infinite when compared to the diameter) core wires 192 and is referred to as an aluminum conductor composite reinforced (ACCR) overhead power transmission conductor. Typically, the core wires 192 comprise crystalline ceramics (i.e., exhibits a discernible X-ray powder diffraction pattern) and/or a mixture of crystalline ceramic and glass (i.e., a fiber may contain both crystalline ceramic and glass phases), although the wires may also comprise glass. In some embodiments, fiber is at least 50 (in some embodiments, at least 55, 60, 65, 70, 75, 80, 85, 90, 95, 96, 97, 98, 99, or even 100) percent by weight crystalline. Examples of suitable crystalline ceramic oxide fibers include refractory fibers such as alumina fibers, aluminosilicate fibers, aluminoborate fibers, aluminoborosilicate fibers, zirconia-silica fibers, and combinations thereof. In some embodiments of the cores of the ACCR overhead power transmission conductors, it is desirable for the fibers to comprise at least 40 (in some embodiments, at least 50, 60, 65, 70, 75, 80, 85, 90, 95, 96, 97, 98, 99, or even 100) percent by volume $Al_2O_3$, based on the total volume of the fiber. In other embodiments, it is desirable for wires 192 to comprise in a range from 40 to 70 (in some embodiments, in a range from 55 to 70, or even 55 to 65) percent by volume $Al_2O_3$, based on the total volume of the fiber.

In some embodiments, exemplary glass fibers are available, for example, from Corning Glass, Corning, N.Y. Typically, the continuous glass fibers have an average fiber diameter in a range from about 3 micrometers to about 19 micrometers. In some embodiments, the glass fibers have an average tensile strength of at least 3 GPa, 4 GPa, and or even at least 5 GPa. In some embodiments, the glass fibers have a modulus in a range from about 60 GPa to 95 GPa, or about 60 GPa to about 90 GPa.

In other embodiments, alumina fibers are described, for example, in U.S. Pat. No. 4,954,462 (Wood et al.) and U.S. Pat. No. 5,185,299 (Wood et al.). In some embodiments, the alumina fibers are polycrystalline alpha alumina fibers, and comprise, on a theoretical oxide basis, greater than 99 percent by weight $Al_2O_3$ and 0.2-0.5 percent by weight $SiO_2$, based on the total weight of the alumina fibers. In another aspect, some desirable polycrystalline, alpha alumina fibers comprise alpha alumina having an average grain size of less than 1 micrometer (or even, in some embodiments, less than 0.5 micrometer). In another aspect, in some embodiments, polycrystalline, alpha alumina fibers have an average tensile strength of at least 1.6 GPa (in some embodiments, at least 2.1 GPa, or even, at least 2.8 GPa), as determined according to the tensile strength test described in U.S. Pat. No. 6,460,597 (McCullough et al.). Exemplary alpha alumina fibers are marketed under the trade designation "NEXTEL 610" by 3M Company, St. Paul, Minn.

Aluminosilicate fibers are described, for example, in U.S. Pat. No. 4,047,965 (Karst et al). Exemplary aluminosilicate fibers are marketed under the trade designations "NEXTEL 440", "NEXTEL 550", and "NEXTEL 720" by 3M Company of St. Paul, Minn. Aluminumborate and aluminoborosilicate fibers are described, for example, in U.S. Pat. No. 3,795,524

(Sowman). Exemplary aluminoborosilicate fibers are marketed under the trade designation "NEXTEL 312" by 3M Company. Zirconia-silica fibers are described, for example, in U.S. Pat. No. 3,709,706 (Sowman).

Typically, the continuous ceramic fibers have an average fiber diameter of at least about 5 micrometers, more typically, in a range from about 5 micrometers to about 20 micrometers; and in some embodiments, in a range from about 5 micrometers to about 15 micrometers.

In addition, the ceramic fibers are typically produced in tows. Tows are known in the fiber art and typically include a plurality of (individual) generally untwisted fibers (typically at least 100 fibers, more typically at least 400 fibers). In some embodiments, tows comprise at least 780 individual fibers per tow, and in some cases, at least 2600 individual fibers per tow, or at least 5200 individual fibers per tow. Tows of various ceramic fibers are available in a variety of lengths, including 300 meters, 500 meters, 750 meters, 1000 meters, 1500 meters, and longer. The fibers may have a cross-sectional shape that is circular, elliptical, or dogbone.

Alternatively, exemplary boron fibers are commercially available, for example, from Textron Specialty Fibers, Inc. of Lowell, Mass. Typically, such fibers have a length on the order of at least 50 meters, and may even have lengths on the order of kilometers or more. Typically, the continuous boron fibers have an average fiber diameter in a range from about 80 micrometers to about 200 micrometers. More typically, the average fiber diameter is no greater than 150 micrometers, most typically in a range from 95 micrometers to 145 micrometers. In some embodiments, the boron fibers have an average tensile strength of at least 3 GPa, and or even at least 3.5 GPa. In some embodiments, the boron fibers have a modulus in a range from about 350 GPa to about 450 GPa, or even in a range from about 350 GPa to about 400 GPa.

Further, exemplary silicon carbide fibers are marketed, for example, by COI Ceramics of San Diego, Calif. under the trade designation "NICALON" in tows of 500 fibers, from Ube Industries of Japan, under the trade designation "TYRANNO", and from Dow Corning of Midland, Mich. under the trade designation "SYLRAMIC".

Exemplary silicon carbide monofilament fibers are marketed, for example, by Specialty Materials, Inc., Lowell, Mass. under the trade designation "SCS-9", "SCS-6", and "Ultra-SCS".

Exemplary aluminum metals for matrix are highly pure (e.g., greater than 99.95%) elemental aluminum or alloys of pure aluminum with other elements, such as copper. Typically, the aluminum matrix material is selected such that the matrix material does not significantly chemically react with the fiber (i.e., is relatively chemically inert with respect to fiber material), for example, to eliminate the need to provide a protective coating on the fiber exterior.

In some embodiments, the aluminum matrix comprises at least 98 percent by weight aluminum, at least 99 percent by weight aluminum, greater than 99.9 percent by weight aluminum, or even greater than 99.95 percent by weight aluminum. Exemplary aluminum alloys of aluminum and copper comprise at least 98 percent by weight aluminum and up to 2 percent by weight copper. In some embodiments, useful aluminum alloys are 1000, 2000, 3000, 4000, 5000, 6000, 7000 and/or 8000 series aluminum alloys (Aluminum Association designations). Although higher purity aluminum tends to be desirable for making higher tensile strength wires, less pure forms of metals are also useful.

Suitable aluminum is available, for example, under the trade designation "SUPER PURE ALUMINUM; 99.99% Al" from Alcoa of Pittsburgh, Pa. Aluminum alloys (e.g., Al-2% by weight Cu (0.03% by weight impurities)) can be obtained, for example, from Belmont Metals, New York, N.Y.

The composite cores typically comprise at least 15 percent by volume (in some embodiments, at least 20, 25, 30, 35, 40, 45, or even 50 percent by volume) of the fibers, based on the total combined volume of the fibers and aluminum matrix material. More typically the composite cores and wires comprise in the range from 40 to 75 (in some embodiments, 45 to 70) percent by volume of the fibers, based on the total combined volume of the fibers and aluminum matrix material.

Typically the average diameter of the core is in a range from about 1 mm to about 15 mm. In some embodiments, the average diameter of core desirable is less than 1 mm, at least 2 mm, or even up to about 3 mm. Typically the average diameter of the composite wire is in a range from about 1 mm to 12 mm, 1 mm to 10 mm, 1 to 8 mm, or even 1 mm to 4 mm. In some embodiments, the average diameter of composite wire desirable is at least 1 mm, at least 1.5 mm, 2 mm, 3 mm, 4 mm, 5 mm, 6 mm, 7 mm, 8 mm, 9 mm, 10 mm, 11 mm, or even at least 12 mm.

Techniques for making aluminum composite wires are known in the art. For example, continuous metal matrix composite wire can be made by continuous metal matrix infiltration processes. One suitable process is described, for example, in U.S. Pat. No. 6,485,796 (Carpenter et al.), the disclosure of which is incorporated herein by reference. Other processing routes for continuous fiber reinforced metal matrix composites are, for example, discussed in ASM Handbook Vol. 21, Composites, pp. 584-588 (ASM International, Metals Park, Ohio), published in 2001, the disclosure of which is incorporated herein by reference.

Overhead power transmission conductor sections having cores comprising a steel wire(s) are commercially available, for example, from Southwire, Carrollton, Ga. Typically, the steel wires of the core are a medium to high strength steel with a nominal tensile strength range of 170 ksi to 280 ksi (1172 MPa to 1931 MPa), and usually are coated to impart good corrosion resistance. Common coating materials include zinc (also known as galvanized) or zinc alloy with 5% aluminum-mischmetal. However, other coating materials may also be employed during manufacture.

Cables, or conductors, utilized in the present invention are typically stranded. A stranded cable typically includes a central wire and a first layer of wires helically stranded around the central wire. Cable stranding is a process in which individual strands of wire are combined in a helical arrangement to produce a finished cable (see, e.g., U.S. Pat. Nos. 5,171,942 (Powers) and 5,554,826 (Gentry)). The resulting helically stranded wire rope provides far greater flexibility than would be available from a solid rod of equivalent cross sectional area. The helical arrangement is also beneficial because the stranded cable maintains its overall round cross-sectional shape when the cable is subject to bending in handling, installation and use. Helically wound cables may include as few as 7 individual strands to more common constructions containing 50 or more strands.

Various embodiments of the invention have been described. However, one skilled in the art will recognize that various modifications may be made to the described embodiments without departing from the scope of the invention. For example, the invention may be embodied as a computer-readable medium that includes instructions to cause a processor to perform any of the methods described herein. These and other embodiments are within the scope of the following claims.

What is claimed is:

1. A method for selecting conductors for installation in an overhead power transmission line, the method comprising:
   identifying at least one desired parameter of an overhead power transmission line tension section to be supported by at least two towers;
   receiving geographic profile information that describes a geographic region to which the overhead power transmission line tension section it to be installed;
   modeling the overhead power transmission line tension section according to the geographic profile information and the at least one identified desired parameter;
   selecting a conductor configuration for the overhead power transmission line tension section based at least part on the overhead power transmission line tension section model and at least one computer-implemented selection rule, wherein the conductor configuration comprises at least a first conductor cable in series with at least a second conductor cable having at least one parameter that is different than at least one parameter of the first conductor cable;
   installing the at least first conductor cable and the at least second conductor cable of the selected conductor configuration in series as the overhead power transmission line tension section supported by the at least two towers at an installation location.

2. The method of claim 1, wherein identifying the at least one desired parameter of the overhead power transmission line tension section comprises receiving an overhead power transmission line input via a user interface of a conductor selection system, and wherein selecting the conductor configuration is automatically performed by the conductor selection system.

3. The method of claim 1, wherein identifying the at least one desired parameter of the overhead power transmission line tension section is performed manually by a human.

4. The method of claim 1, wherein the first and second conductors differ in at least one of a weight, a thermal expansion, a diameter, a reinforcing material, a conductive material, an electrical resistance, a tensile strength, an elasticity, or a cost.

5. The method of claim 1, wherein the at least two towers include at least one tangent tower that supports the overhead power transmission line tension section between two dead-end towers.

6. The method of claim 1, wherein the at least one desired parameter of the overhead power transmission line tension section comprises at least one of an overhead power transmission line tension section clearance, an overhead power transmission line tension section sag, an overhead power transmission line electrical characteristic, an overhead power transmission line tension section weight, and an overhead power transmission line tension section tension.

7. The method of claim 1, wherein selecting the conductor configuration further comprises selecting the conductor configuration of the overhead power transmission line tension section based upon at least one of a conductor configuration cost, a conductor configuration electrical characteristic, or a conductor configuration force on at least one tower.

8. The method of claim 1, further comprising receiving tower input identifying at least one of a tower height or a tower location.

9. A computer-implemented system that selects conductors for an overhead power transmission line, the system comprising:
   a processor that identifies at least one desired parameter of an overhead power transmission line tension section to be supported by at least two towers, and receiving geographic profile information that describes a geographic region to which the overhead power transmission line tension section it to be installed, wherein the processor models the overhead power transmission line tension section according to the geographic profile information and the at least one identified desired parameter, and selects a conductor configuration for the overhead power transmission line tension section based at least part upon the overhead power transmission line tension section model and at least one selection rule, wherein the conductor configuration comprises at least a first conductor cable in series with at least a second conductor cable having at least one parameter that is different than at least one parameter of the first conductor.

10. The system of claim 9, further comprising a memory that stores the at least one desired parameter, the geographic profile information, and the at least one selection rule.

11. The system of claim 10, wherein the processor models the overhead power transmission line tension section according to the geographic profile information, the at least one desired parameter, and the at least one selection rule.

12. The system of claim 9, wherein a user interface receives an overhead power transmission line input that is provide to the processor, and which allows the processor to identify the at least one desired parameter of the overhead power transmission line tension section.

13. The system of claim 9, wherein a user interface receives geographic profile information that describes a geographic region to which the overhead power transmission line tension section is to be installed, and provides the geographic profile information to the processor.

14. The system of claim 9, wherein the first and second conductor cables are different in at least one of a weight, a thermal expansion, a diameter, a reinforcing material, a conductive material, an electrical resistance, a tensile strength, an elasticity, or a cost.

15. The system of claim 9, wherein the at least one desired parameter of the overhead power transmission line tension section comprises at least one of an overhead power transmission line tension section clearance, an overhead power transmission line tension section sag, an overhead power transmission line electrical characteristic, an overhead power transmission line tension section weight, and an overhead power transmission line tension section tension.

16. The system of claim 9, wherein the processor further selects the conductor configuration of the overhead power transmission line tension section based upon at least one of the conductor configuration cost, the conductor configuration electrical characteristic, or the conductor configuration force on at least one tower.

17. The system of claim 9, wherein the at least two towers include at least one tangent tower that support the overhead power transmission line tension section between two dead-end towers.

18. The system of claim 9, wherein a user interface receives a tower input identifying at least one of a tower height or a tower location for the at least two towers.

19. A computer-readable medium in a computing device comprising a reader for the computer-readable medium and a processor, the computer-readable medium comprising instructions that cause the processor to:
   identify at least one desired parameter of an overhead power transmission line tension section to be supported by at least two towers;

receive geographic profile information that describes a geographic region to which the overhead power transmission line tension section it to be installed;

model the overhead power transmission line tension section according to the at least one identified desired parameter and the geographic profile information; and select a conductor configuration of the overhead power transmission line tension section based at least part upon the overhead power transmission line tension section model and at least one selection rule, wherein the conductor configuration comprises at least a first conductor cable in series with at least a second conductor cable having at least one parameter that is different than at least one parameter of the first conductor cable.

* * * * *